(12) United States Patent
Ishikawa et al.

(10) Patent No.: US 7,994,826 B2
(45) Date of Patent: Aug. 9, 2011

(54) DRIVE CIRCUIT FOR POWER SEMICONDUCTOR SWITCHING DEVICE

(75) Inventors: Katsumi Ishikawa, Hitachinaka (JP); Hideki Miyazaki, Hitachi (JP); Masahiro Nagasu, Hitachinaka (JP); Yasuhiko Kono, Naka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/624,730

(22) Filed: Jan. 19, 2007

(65) Prior Publication Data

US 2007/0200602 A1 Aug. 30, 2007

(30) Foreign Application Priority Data

Feb. 27, 2006 (JP) ................. 2006-049485

(51) Int. Cl.
*H03B 1/00* (2006.01)
(52) U.S. Cl. .................. 327/110; 327/376; 327/434
(58) Field of Classification Search .............. 327/110, 327/427, 434, 437, 374, 376
See application file for complete search history.

(56) References Cited

U.S. PATENT DOCUMENTS

| | | | | |
|---|---|---|---|---|
| 5,909,039 A | * | 6/1999 | Bakowski et al. | 257/139 |
| 6,111,453 A | * | 8/2000 | Uchida et al. | 327/384 |
| 6,330,143 B1 | * | 12/2001 | Maly et al. | 361/101 |
| 7,214,627 B2 | * | 5/2007 | Merrett et al. | 438/745 |

FOREIGN PATENT DOCUMENTS

| | | |
|---|---|---|
| DE | 10334832 | 3/2004 |
| JP | 2002-044964 | 2/2002 |
| JP | 2004-48843 | 2/2004 |

OTHER PUBLICATIONS

Igarashi, S., et al; "An Active Control Gate Drive Circuit for IGBTs to Realize Low-noise and Snubberless System," (pp. 69-72); 1997 IEEE, 0-7803-3993-2/97.
Lee, Hwang-Geol, et al; "An Improved Gate Control Scheme for Snubberless Operation of High Power IGBTs," (pp. 975-982); IEEE Industry Application Society Annual Meeting, New Orleans Louisiana, Oct. 5-9, 1997.
Decision of Feb. 24, 2011 Regarding German Patent Application No. 10 2007 002 543.4-32 [11 pages] (In German) with English language translation.

* cited by examiner

*Primary Examiner* — Long Nguyen
(74) *Attorney, Agent, or Firm* — Antonelli, Terry, Stout & Kraus, LLP.

(57) ABSTRACT

A gate driving circuit for a voltage-driven power semiconductor switching device has (a) the voltage-driven power semiconductor switching device, (b) a driving circuit for supplying a drive signal to the gate electrode of the switching device, and (c) an inductance between the emitter control terminal or source control terminal of the switching device and the emitter main terminal or source main terminal of a semiconductor module. A voltage produced across the inductance is detected. The gate-driving voltage or gate drive resistance is made variable based on the detected value.

8 Claims, 10 Drawing Sheets

DRIVE CIRCUIT FOR POWER SEMICONDUCTOR SWITCHING DEVICE

BACKGROUND OF THE INVENTION

The present invention relates to a gate driving circuit for a voltage-driven power semiconductor switching device used in a power converter system.

In voltage-driven power semiconductor devices such as MOSFETs and IGBTs, development is in progress toward handling larger electrical currents. Furthermore, in MOSFETs used in power supply applications, development is in progress towards having lower power-supply voltages in addition to handling larger electrical currents. Where a power semiconductor device is driven with large currents and low voltages, if the external interconnect inductance is large, an excessive voltage is generated across the power semiconductor device. This creates the possibility that the device is destroyed. Therefore, the key technique is to reduce the external interconnect inductance or to reduce the internal inductance of the power semiconductor module. Such a technique for reducing external interconnect inductances is disclosed, for example, in JP2002-44964 (patent reference 1), especially from paragraph 0017 to paragraph 0019.

SUMMARY OF THE INVENTION

When a device turns on, if the emitter inductance is large, a voltage determined by the product of the emitter inductance and the current increase rate (di/dt) produced when the device is turned on is produced across the emitter inductance. Therefore, there is the problem that the switching speed is reduced by the voltage produced across the emitter inductance. Furthermore, in recent years, power semiconductor devices tend to be used with lower power-supply voltages. With this trend, threshold voltages for MOSFETs, IGBTs, and other similar devices tend to be lowered. In addition, power semiconductor devices tend to treat larger electrical currents in recent years. Consequently, voltages produced across emitter inductances tend to increase. The emitter inductances greatly affect the switching speed.

It is an object of the present invention to provide a drive circuit for a power semiconductor switching device with a high switching speed.

A gate driving circuit according to the present invention is used for a power semiconductor switching device that is a voltage-driven power semiconductor switching device. The gate driving circuit supplies a drive signal to the gate electrode of the power semiconductor switching device. An inductance is present between an emitter control terminal or a source control terminal of the switching terminal and an emitter main terminal or a source main terminal of a semiconductor module. A voltage produced across the inductance is detected and a gate-driving voltage or gate drive resistance is made variable based on the detected value.

According to the present invention, control is provided utilizing the voltage produced across the emitter inductance and, therefore, the power semiconductor device can be driven at high speed.

Other objects, features and advantages of the invention will become apparent from the following description of the embodiments of the invention taken in conjunction with the accompanying drawings.

DESCRIPTION OF THE EMBODIMENTS

Embodiments of the present invention are described in detail with reference to the drawings.

Embodiment 1

Figure 1:
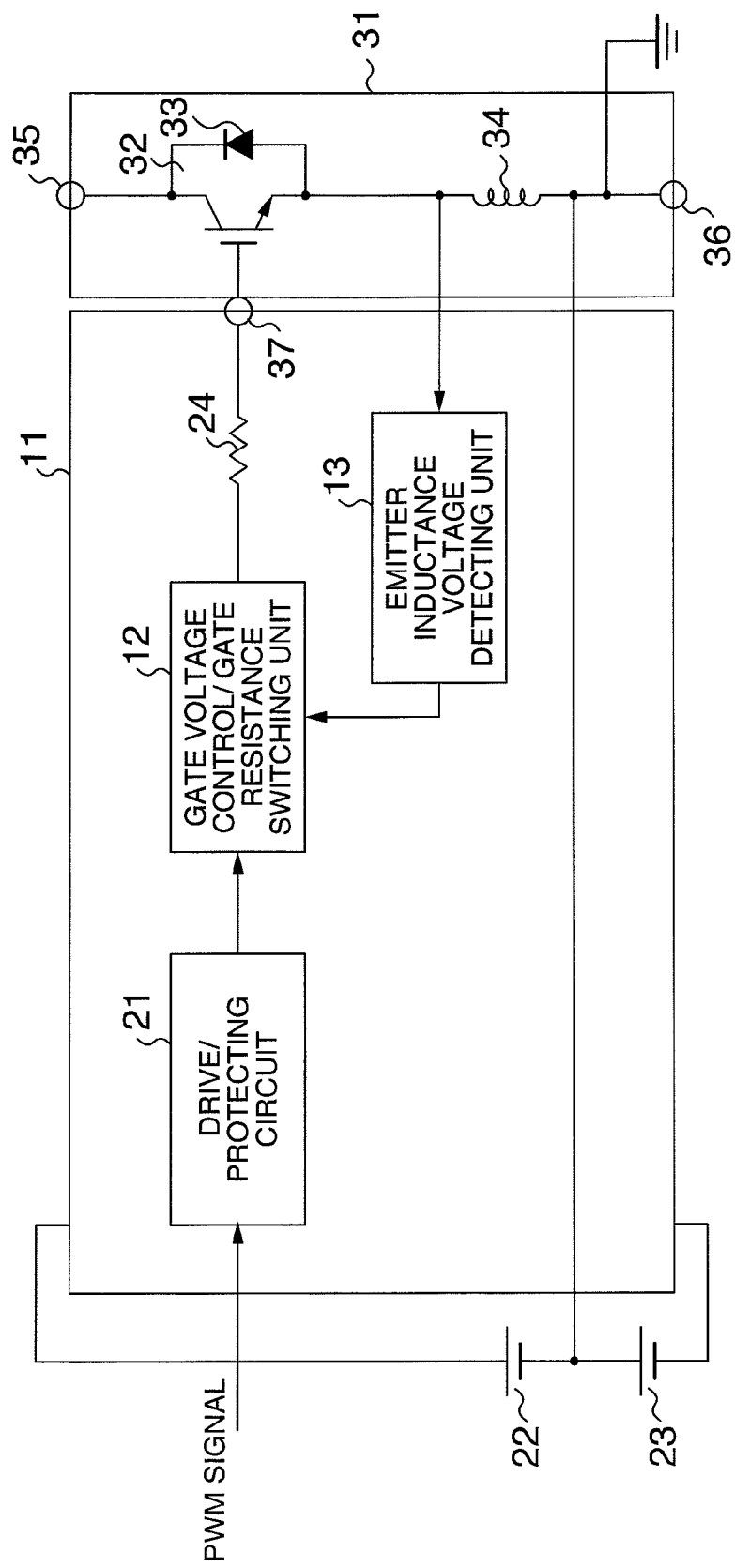
FIG. 1 is a block diagram of a drive circuit for a power semiconductor device, the drive circuit being built according to Embodiment 1 of the present invention.

FIG. 1 is a block diagram of a drive circuit for a power semiconductor device, the drive circuit being built according to the present embodiment. An IGBT module 31 is connected with the drive circuit, 11. In the IGBT module 31, an IGBT 32 and a freewheel diode 33 are connected in parallel, the IGBT being a voltage-driven switching device. An emitter inductance 34 depending on the length of interconnects made, for example, by wire bonding is present between the emitter electrode of the IGBT 32 and the emitter terminal 36 of the IGBT module 31.

The prior-art drive circuit for an IGBT is made up of a drive/protecting circuit 21, a positive bias power supply 22 for the drive circuit, and a negative bias power supply 23 for the drive circuit. There is no means for compensating the voltage across the emitter inductance. Therefore, a voltage produced across the emitter inductance when it is turned on reduces the switching speed. Furthermore, in recent years, power semiconductor devices have tended to be used with lower power-supply voltages. With this trend, threshold voltages at which main currents start to circulate through MOSFETs, IGBT, and other devices have become lower. Additionally, in recent years, power semiconductor devices have tended to handle larger electrical currents. Consequently, the voltage produced across the emitter inductance 34 tends to increase. This emitter inductance 34 greatly affects the switching speed.

Figure 2:
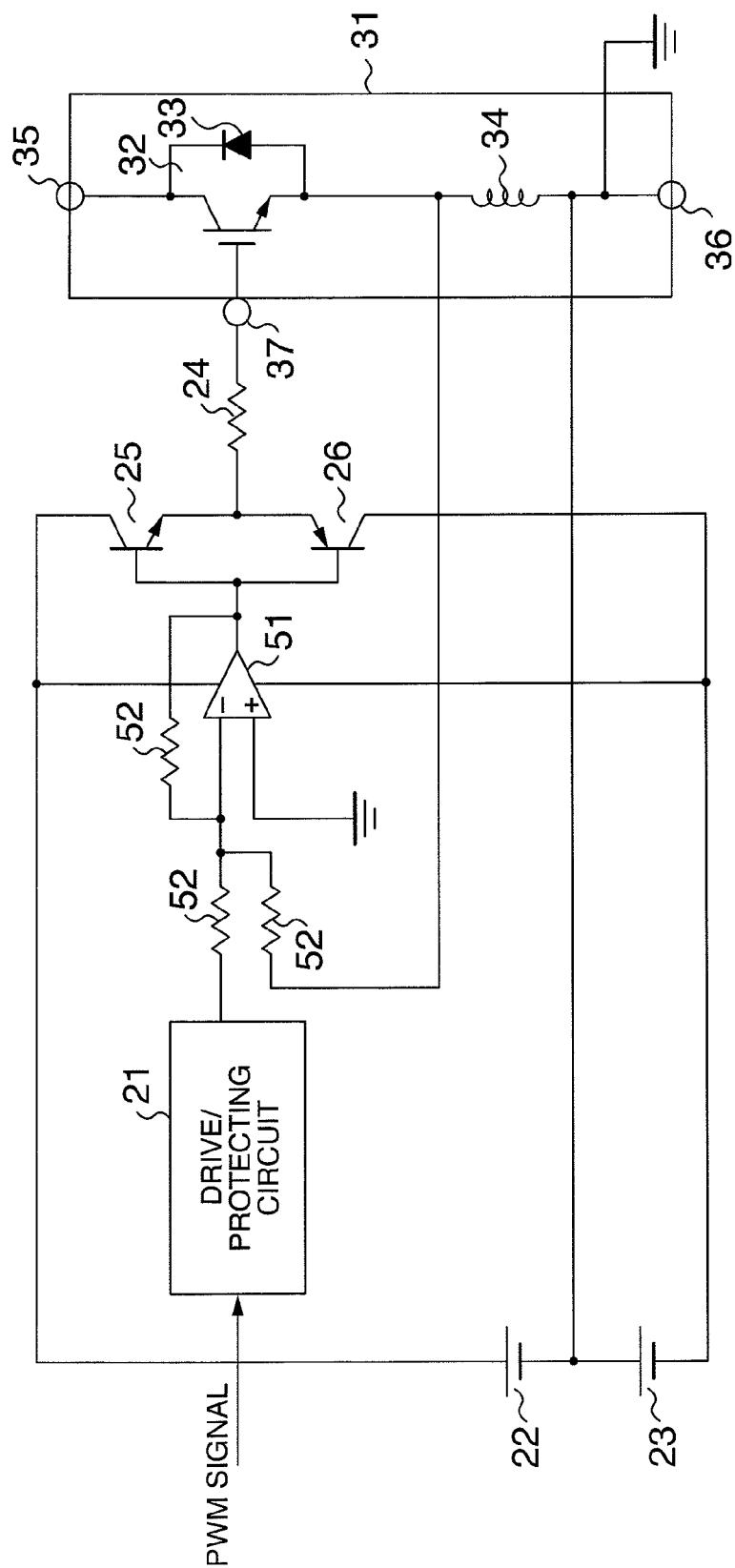
FIG. 2 is a circuit diagram of the drive circuit for the power semiconductor device, the drive circuit being built according to Embodiment 1 of the invention.

The drive circuit 11 of the present embodiment has an emitter inductance voltage-detecting unit 13 and a gate voltage control/gate resistance switching unit 12. A specific circuit diagram of the drive circuit of the present embodiment is shown in FIG. 2, the drive circuit being used for the power semiconductor device. In the present embodiment, an adder circuit is constituted using an operational amplifier 51 and a resistor 52 for the adder circuit. In the present embodiment, a voltage produced by the emitter inductance 34 when it is turned on can be added to the output voltage from the drive/protecting circuit.

Figure 3:
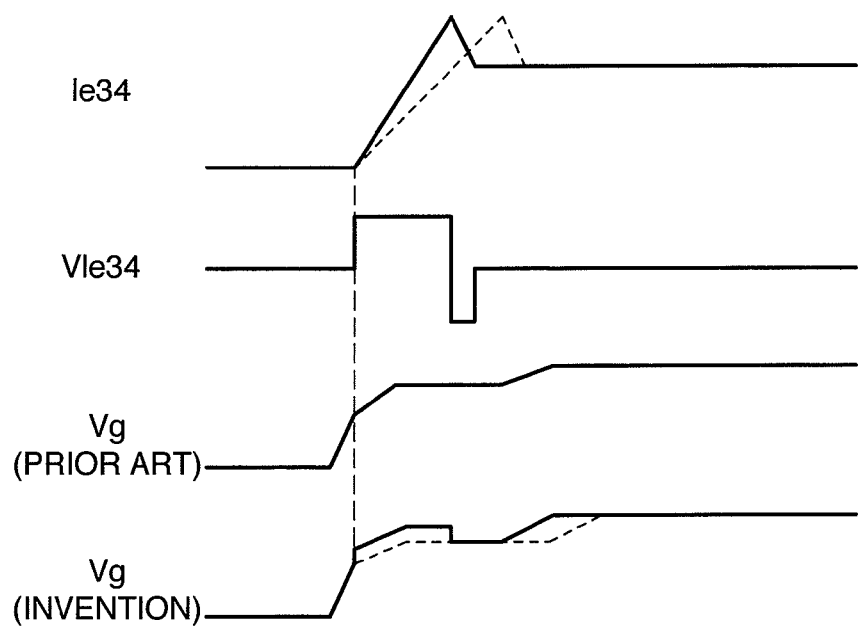
FIG. 3 is a waveform diagram illustrating the difference between a switching waveform produced in Embodiment 1 and a switching waveform produced in the prior-art technique.

The difference between a switching waveform produced in the present embodiment and a switching waveform produced in the prior-art technique is shown in FIG. 3. The switching waveform produced in the present embodiment is indicated by the solid line. The switching waveform produced in the prior-art technique is indicated by the dotted line. In the prior-art technique, when the device is turned on, the voltage produced by the emitter inductance 34 is not added and so the region of the terrace voltage of the gate voltage waveform (Vg) that is kept constant when the device is turned on is lengthened. In the present embodiment, the voltage produced by the emitter inductance 34 when it is turned on is added. The gate voltage is increased by an amount corresponding to the voltage produced across the inductance during the turn-on period in which the collector current of the IGBT is increasing. Consequently, the di/dt can be increased during the turn-on period.

According to the present embodiment, control is provided utilizing the voltage produced across the emitter inductance 34 and so the power semiconductor device can be driven at high speed.

Embodiment 2

Figure 4:
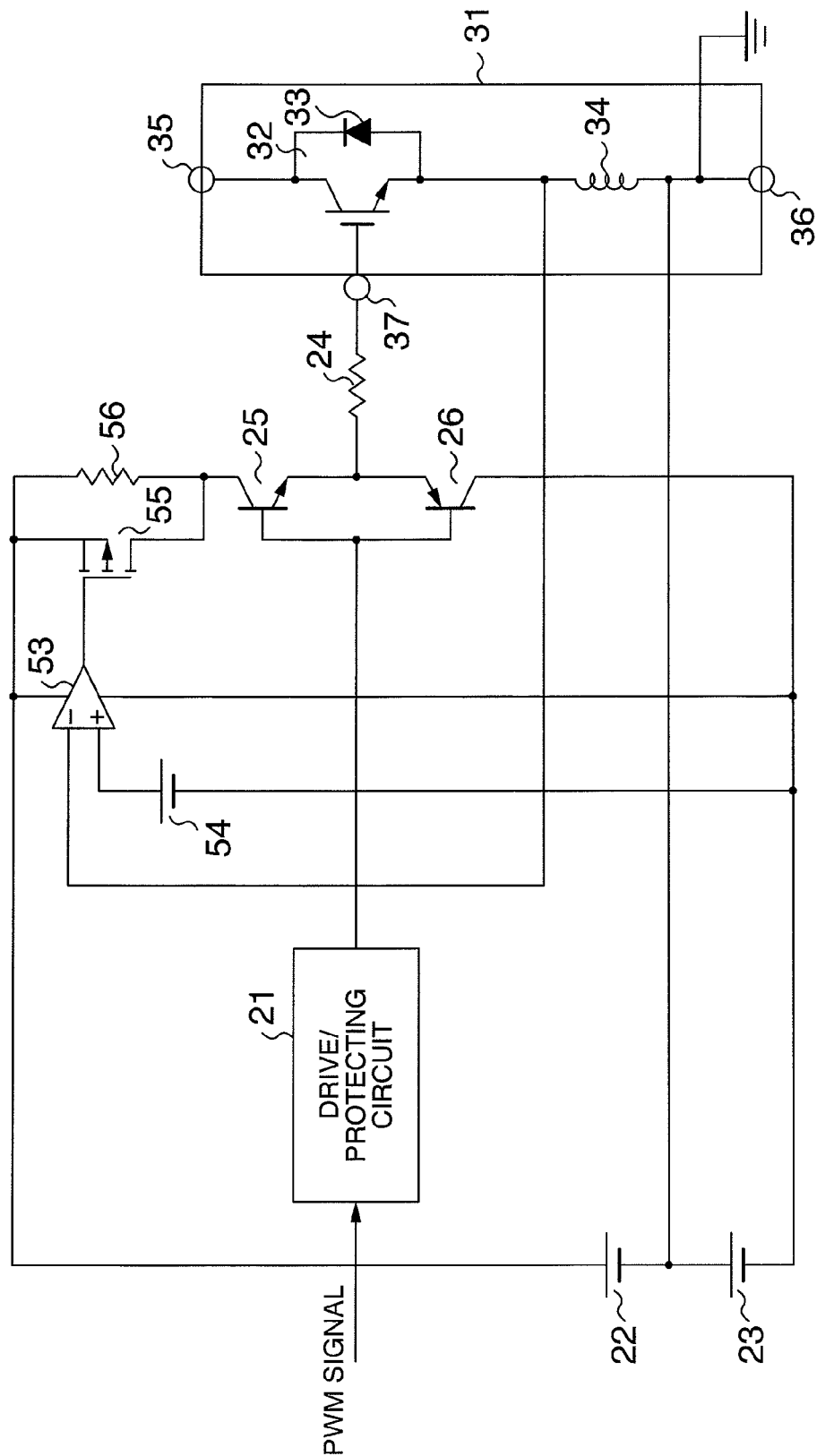
FIG. 4 is a circuit diagram of a drive circuit for a power semiconductor device, the drive circuit being built according to Embodiment 2 of the invention.

A circuit diagram of the drive circuit for a power semiconductor device is shown in FIG. 4, the drive circuit being built according to the present embodiment. Like components are indicated by like numerals in both the block diagram of Embodiment 1 and the circuit diagram of FIG. 4. In Embodiment 1, the gate voltage control/gate resistor switching unit 12 is a means for controlling the gate voltage. In the present embodiment, the unit 12 is a gate resistor-switching unit.

In the present embodiment, the gate resistor-switching unit is constituted using a comparator 53, a comparison power supply 54, a pMOSFET 55, and a switching gate resistor 56. Because of this configuration, the gate resistance during the period in which a voltage is produced across the emitter inductance 34 during turn-on period can be reduced.

Figure 5:
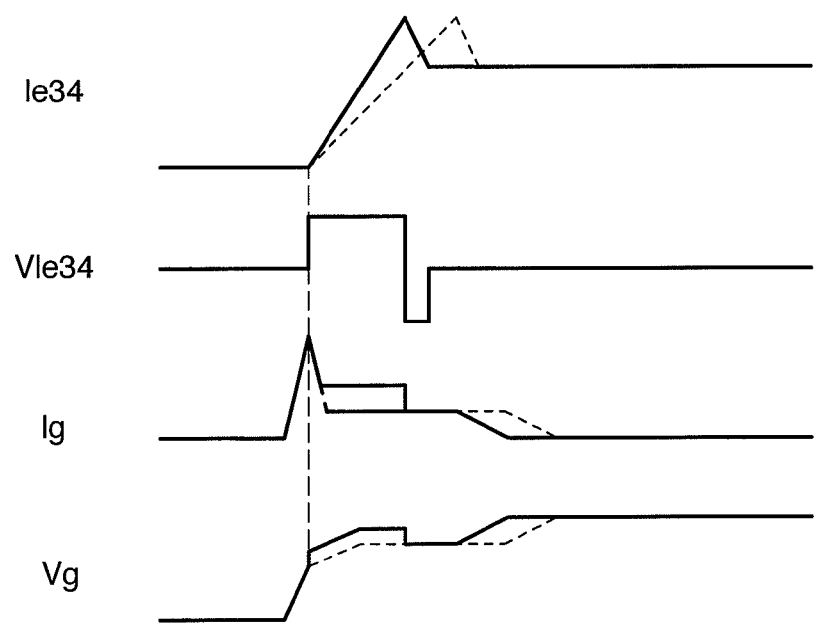
FIG. 5 is a waveform diagram illustrating the difference between a switching waveform produced in Embodiment 2 and a switching waveform produced in the prior-art technique.

The difference between a switching waveform produced in the present embodiment and a switching waveform produced in the prior-art technique is shown in FIG. 5. The switching waveform produced in the present embodiment is indicated by the solid line. The switching waveform produced in the prior-art technique is indicated by the dotted line. In the prior-art technique, when the device is turned on and a voltage is produced across the emitter inductance 34, there is no means for making the gate resistance variable. Therefore, the region of the terrace voltage of the gate voltage waveform (Vg) that is kept constant during turn-on period is lengthened. In the present embodiment, there is provided a means for making the gate resistance variable when the device is turned on and a voltage is produced across the emitter inductance 34. In particular, in the present embodiment, when the device is turned on and a voltage is produced across the emitter inductance 34, the comparator 53 makes a decision as to whether a voltage has been produced across the emitter inductance. If such a voltage is produced, the pMOSFET 55 is turned on. Therefore, in the present embodiment, when the device is turned on, the turn-on operation is performed with the gate resistance determined by the sum of the resistance of the gate resistor 24 and the resistance of the switching gate resistor 56. On the other hand, if an emitter inductance voltage is produced, a turn-on operation is performed with a constant determined by the resistance of the gate resistor 24. Therefore, the gate resistance is reduced during the turn-on period in which the collector current of the IGBT is increasing. In consequence, the di/dt can be increased during turn-on.

In this way, in the present embodiment, control is provided utilizing the voltage produced across the emitter inductance and, therefore, the power semiconductor device can be driven at high speed.

Embodiment 3

Figure 6:
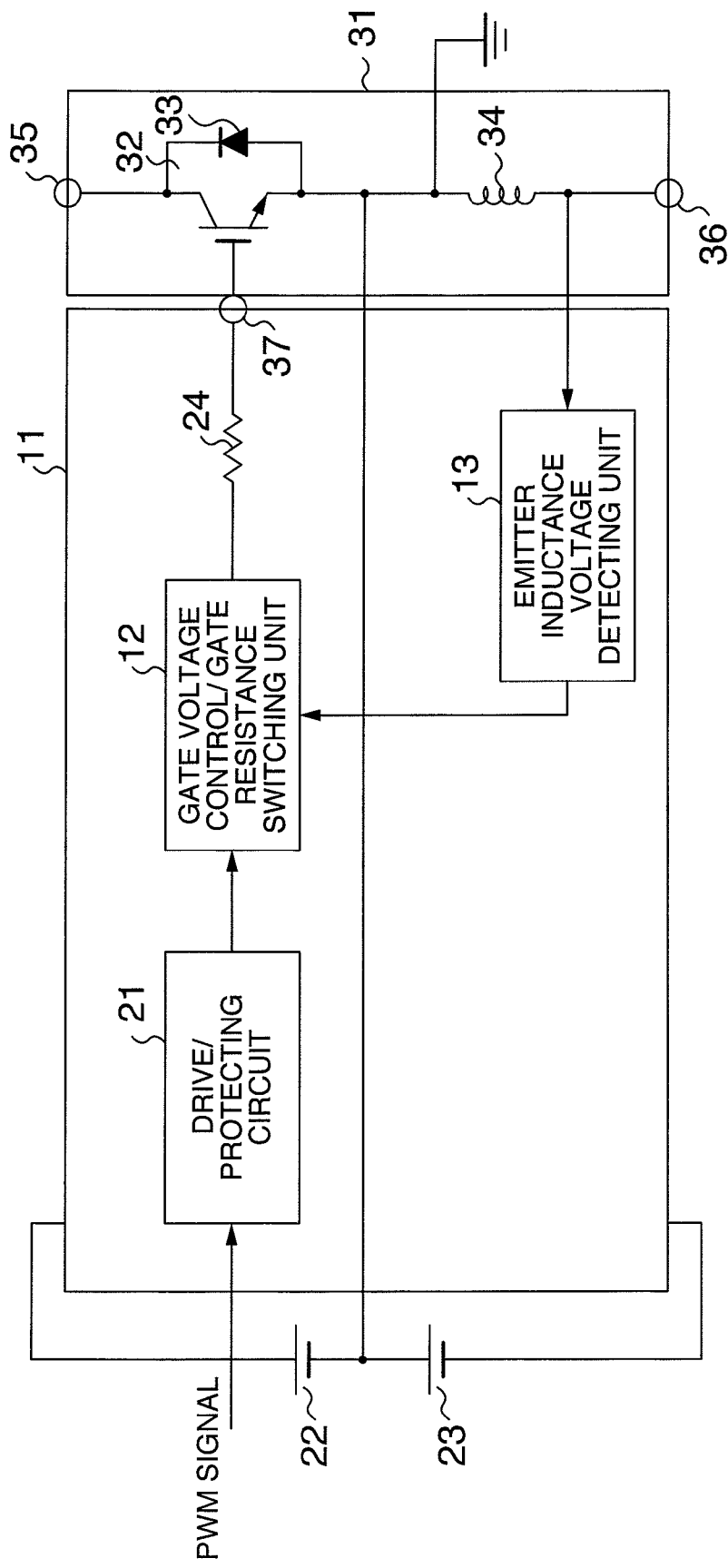
FIG. 6 is a block diagram of a drive circuit for a power semiconductor device, the drive circuit being built according to Embodiment 3 of the invention.

A block diagram of the drive circuit for a power semiconductor device is shown in FIG. 6, the drive circuit being built according to the present embodiment. Like components are indicated by like numerals in both the block diagram of Embodiment 1 and the block diagram of FIG. 6. The difference of the present embodiment with the block diagram of the drive circuit of FIG. 1 for a power semiconductor device is the method of connecting ground potential. In recently fabricated power modules, an emitter terminal used for control is often made separate from the emitter terminal 36 of an IGBT module to reduce the effects of the voltage produced across the emitter inductance 34 when it is turned on (i.e., during switching). In this case, the emitter terminal for control and the ground potential of the drive circuit 11 of the present embodiment are at equipotential.

Figure 7:
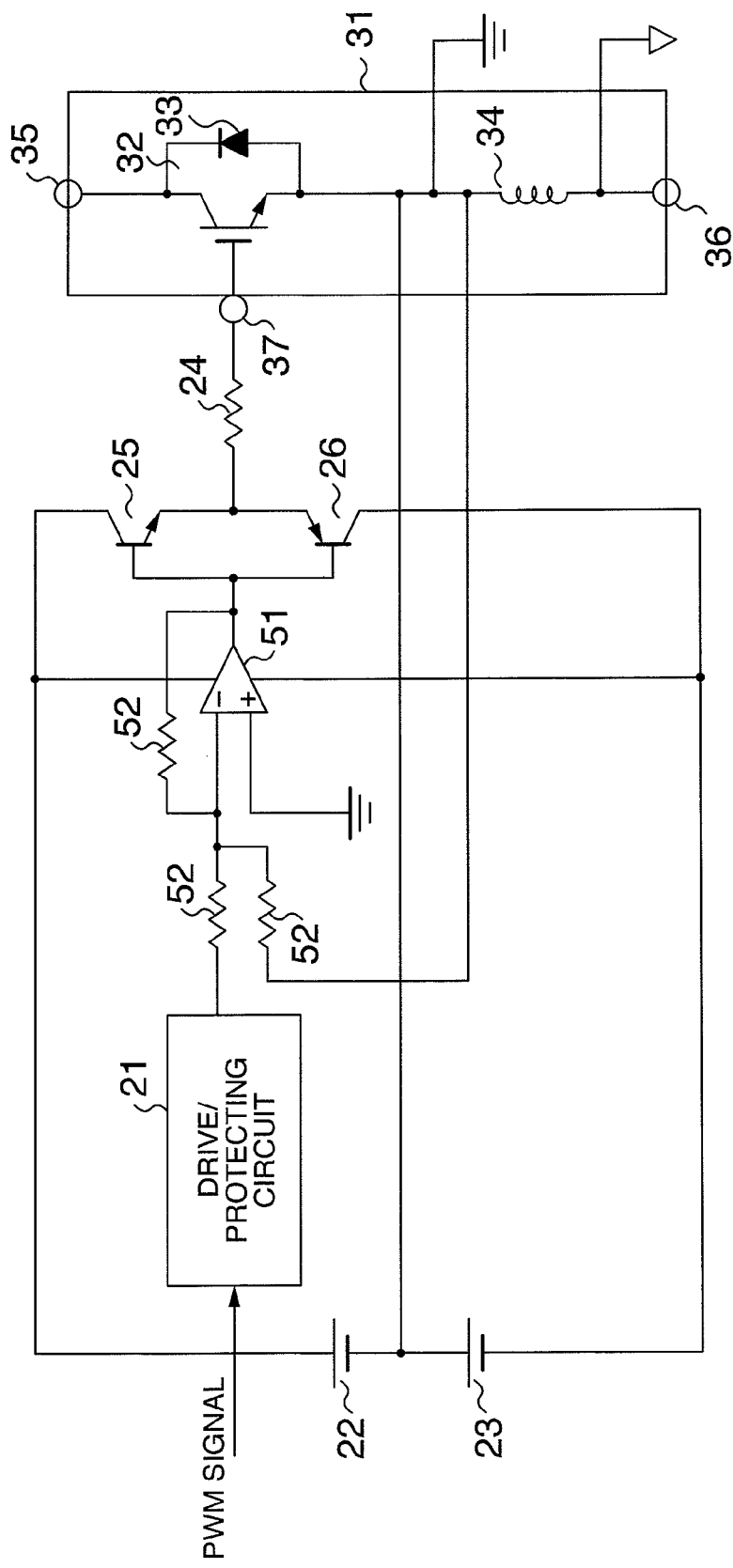
FIG. 7 is a circuit diagram of the drive circuit for the power semiconductor device, the drive circuit being built according to Embodiment 1.

A specific circuit diagram of the drive circuit of the present embodiment is shown in FIG. 7, the drive circuit being used for the power semiconductor device. In the present embodiment, an adder circuit is constituted using an operational amplifier 51 and a resistor 52 for the adder circuit. The difference with the embodiment of FIG. 1 is that a comparison potential for the operational amplifier 51 is the potential at the emitter terminal 36 of the IGBT module instead of an emitter terminal for control. Consequently, a voltage produced across the emitter inductance 34 during turn-on can be added to the output voltage from the drive/protecting circuit.

According to the present embodiment, control is provided utilizing the voltage produced across an emitter inductance and so the power semiconductor device can be driven at high speed.

Embodiment 4

Figure 8:
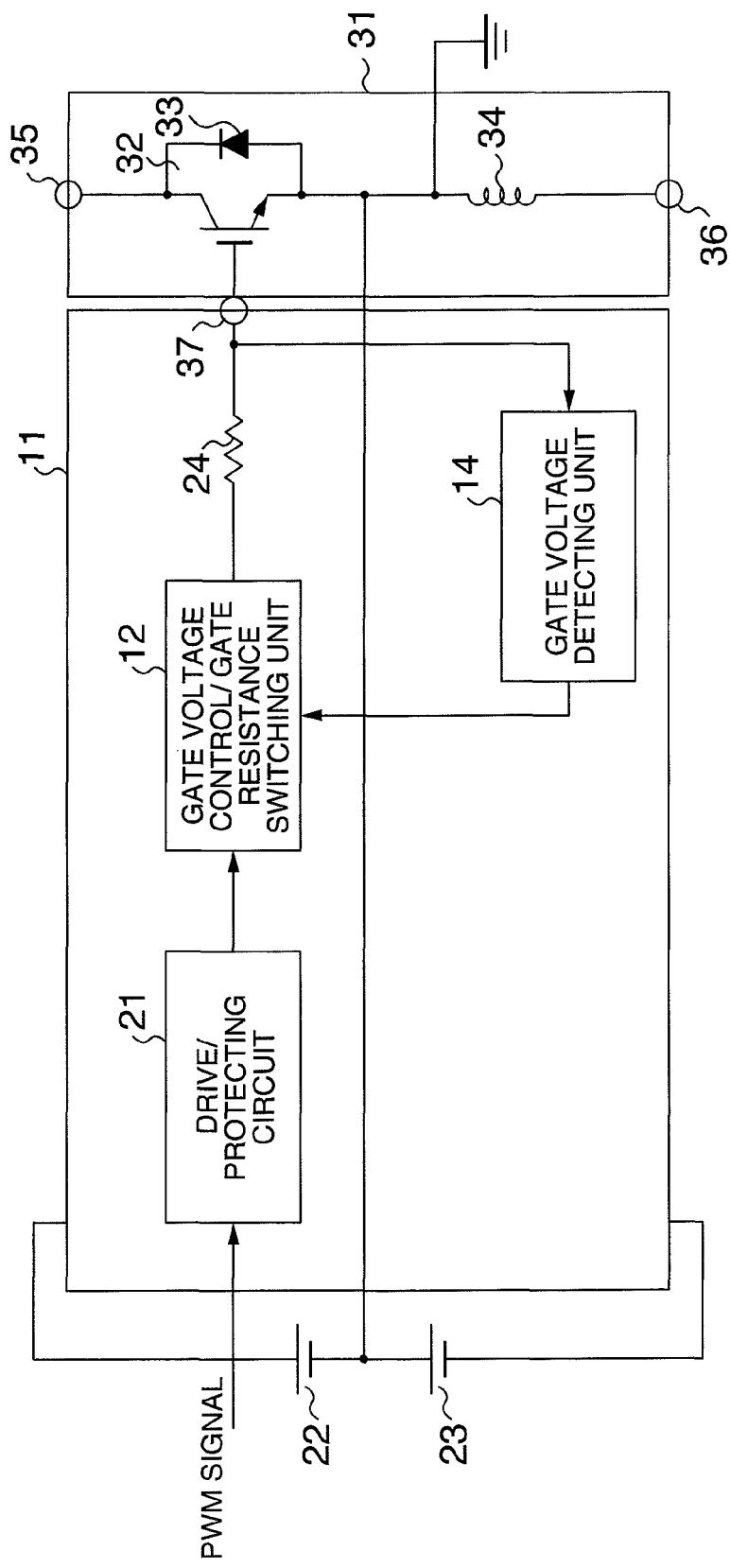
FIG. 8 is a block diagram of a drive circuit for a power semiconductor device, the drive circuit being built according to Embodiment 4 of the invention.

A block diagram of the drive circuit for a power semiconductor device is shown in FIG. 8, the drive circuit being built according to the present embodiment. Like components are indicated by like numerals in both the block diagram of Embodiment 1 and the block diagram of FIG. 8. In the present embodiment, a gate voltage detection unit 14 is mounted instead of detection of the voltage across the emitter inductance 34 produced during turn-on in the block diagram of the drive circuit of FIG. 1 for a power semiconductor device. In the present embodiment, the gate voltage is detected by this gate voltage detection unit 14. The current through the IGBT 32 can be estimated based on the detected gate voltage. Therefore, the power semiconductor device can be driven at high speed in the same way as in the case where the emitter inductance 34 is used.

Embodiment 5

Figure 9:
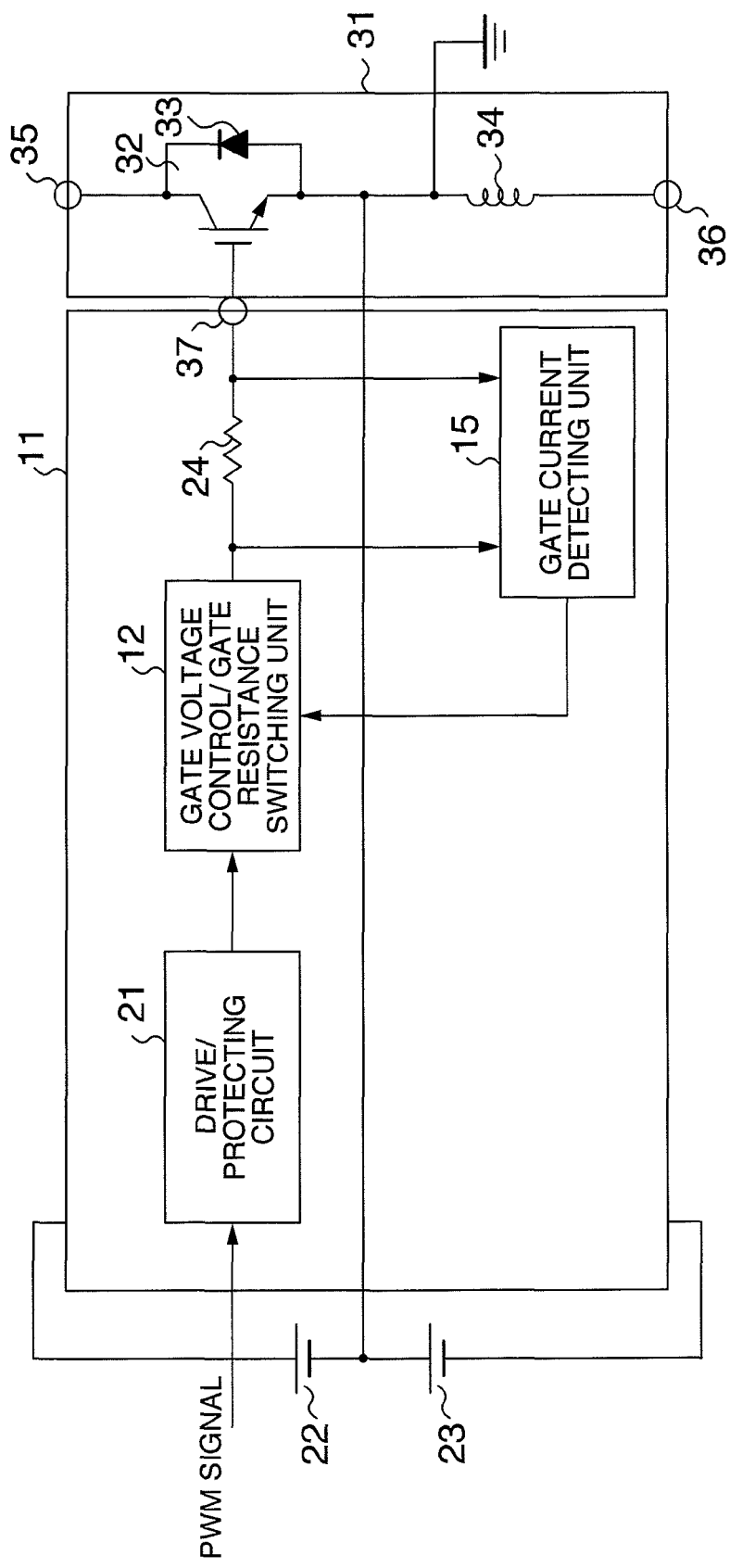
FIG. 9 is a block diagram of a drive circuit for a power semiconductor device, the drive circuit being built according to Embodiment 5 of the invention.

A block diagram of the drive circuit for a power semiconductor device is shown in FIG. 9, the drive circuit being built according to the present embodiment. Like components are indicated by like numerals in both the block diagram of Embodiment 4 and the block diagram of FIG. 9. In the present embodiment, a gate current detection unit 15 is mounted instead of the gate voltage detection unit 14 in the block diagram of the drive circuit of FIG. 1 for a power semiconductor device. In the present embodiment, the gate voltage is found based on the gate current using the gate current detection unit 14 and the current through the IGBT 32 can be estimated based on the gate voltage, in the same way as in Embodiment 4. Consequently, the power semiconductor device can be driven at high speed in the same way as in the case where the emitter inductance 34 is employed.

Embodiment 6

Figure 10:
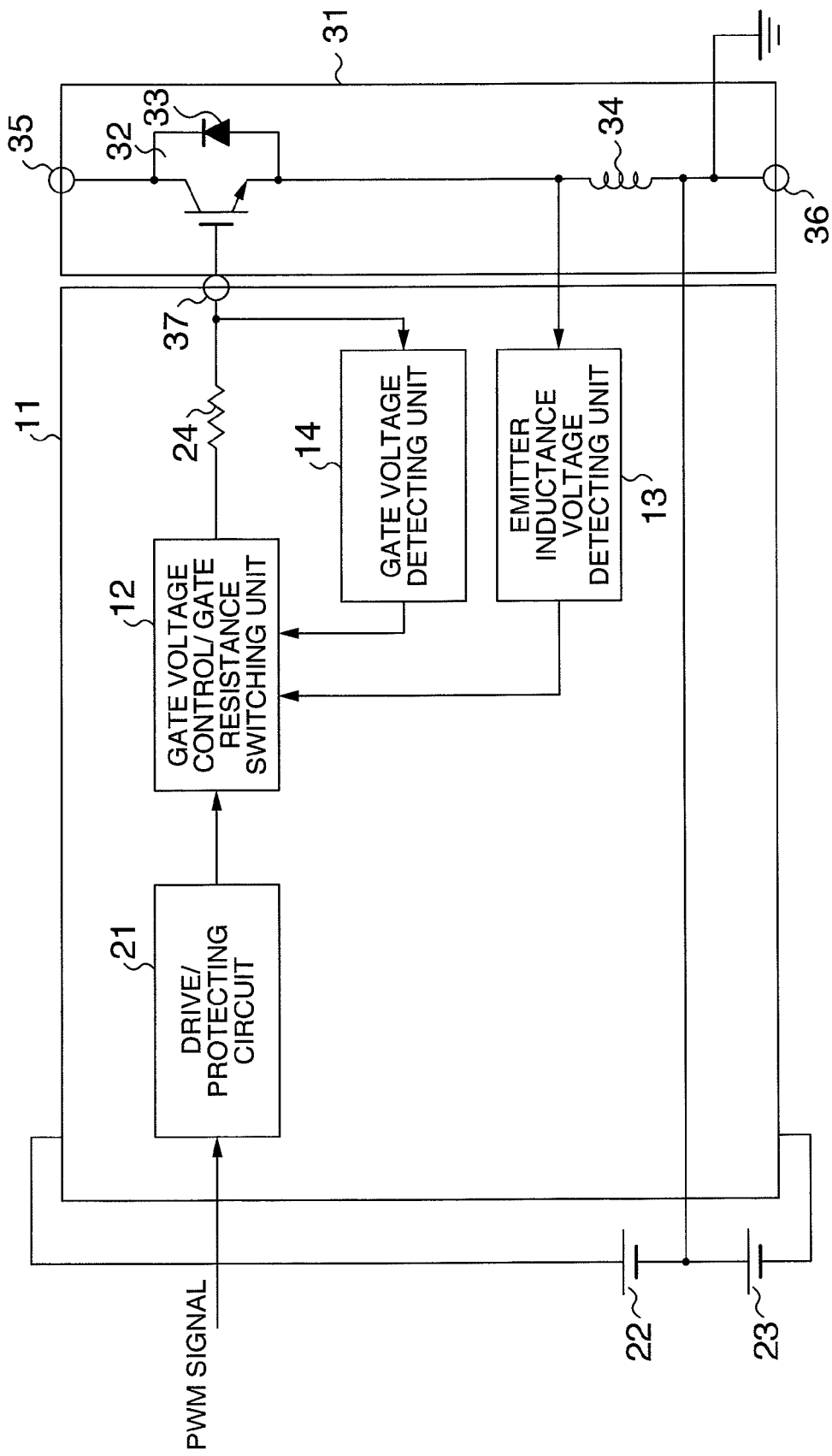
FIG. 10 is a block diagram of a drive circuit for a power semiconductor device, the drive circuit being built according to Embodiment 6 of the invention.

A block diagram of the drive circuit for a power semiconductor device is shown in FIG. 10, the drive circuit being built according to the present embodiment. Like components are indicated by like numerals in all the block diagrams of Embodiments 1 and 4 and the present embodiment. The difference of the present embodiment with Embodiments 1 and 4 is that the voltage across the emitter inductance 34 and the gate voltage are simultaneously observed. According to the present embodiment, more accurate control is enabled.

Embodiment 7

Figure 11:
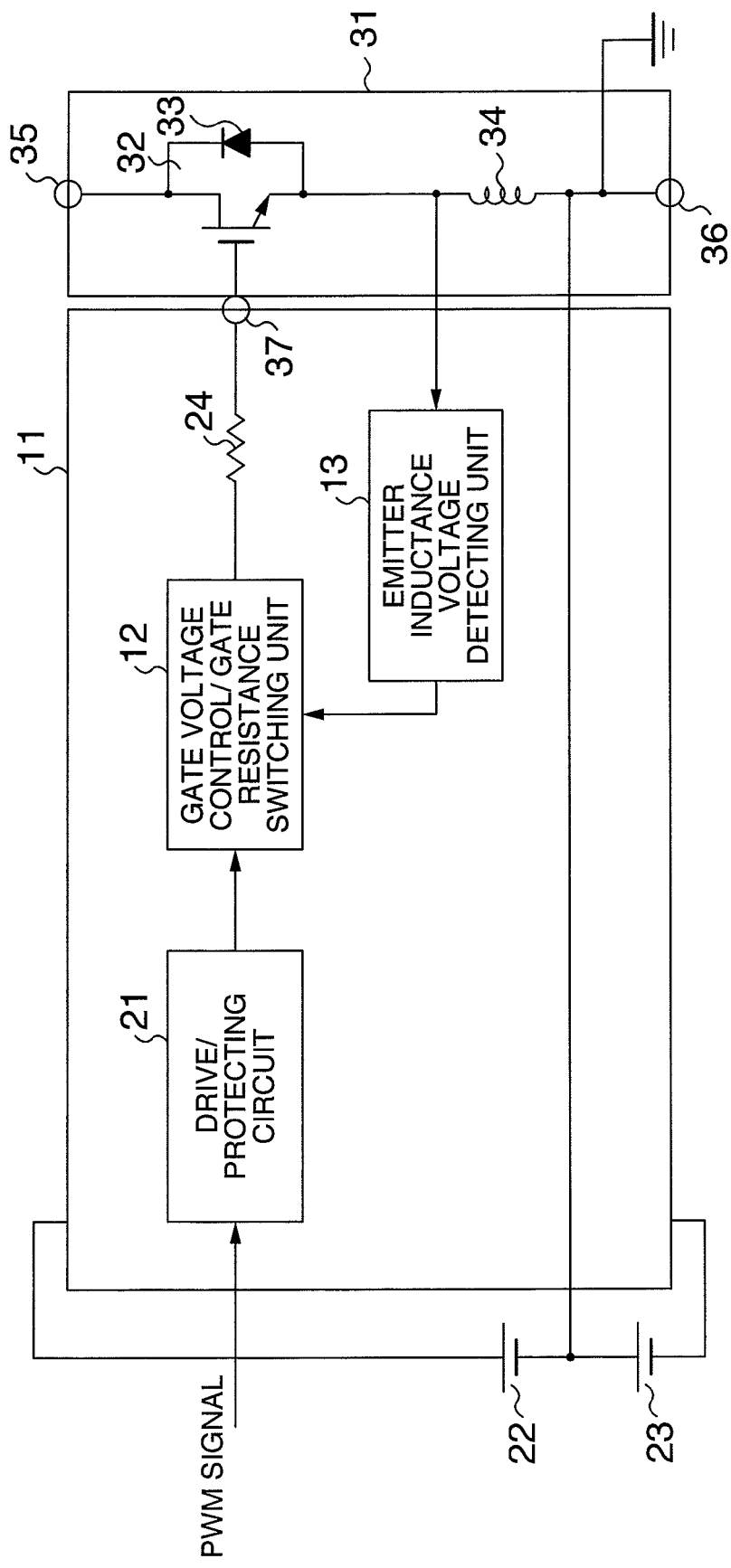
FIG. 11 is a block diagram of a drive circuit for a power semiconductor device, the drive circuit being built according to Embodiment 7 of the invention.

A block diagram of the drive circuit for a power semiconductor device is shown in FIG. 11, the drive circuit being built according to the present embodiment. Like components are indicated by like numerals in both the block diagram of Embodiment 1 and the block diagram of FIG. 11. The difference of the present embodiment with Embodiment 1 is that a SiC JFET is used instead of an IGBT. In a normally-off SiC JFET, the threshold voltage is set to about 1 to 2 V. The turn-on drive voltage is set to a very low value of about 3 V. Therefore, when SiC JFETs are switched at higher speeds, control using the emitter inductance 34, gate voltage, or gate current is necessary. The drive circuit of the present embodiment permits high-speed switching of SiC JFETs.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A gate driving circuit for a power semiconductor switching device,
wherein the gate driving circuit supplies a drive signal to a gate electrode of the power semiconductor switching device that is a voltage-driven power semiconductor switching device,
wherein an inductor is located between an emitter control terminal or a source control terminal of the switching device and an emitter main terminal or a source main terminal of a semiconductor module, and
wherein a detector is located at a junction point between the gate of the switching device, the emitter control terminal or the source control terminal and the inductor to detect a value of a voltage produced across the inductor during a period when the switching device is being turned ON and a gate-driving voltage or gate drive resistance is made variable during said period when the switching device is being turned ON based on the detected value.

2. A gate driving circuit for a power semiconductor switching device as set forth in claim 1, wherein the gate-driving voltage is increased during said period based on the detected value to increase di/dt across said inductor during said period when the switching device is being turned on to shorten the switching time required to turn ON said switching device.

3. A gate driving circuit for a power semiconductor switching device as set forth in claim 1, wherein the gate drive resistance is reduced during said period based on the detected value to increase di/dt across said inductor during said period when the switching device is being turned on to shorten the switching time required to turn ON said switching device.

4. A gate driving circuit for a power semiconductor switching device as set forth in claim 1, wherein said power semiconductor switching device is a SiC power device.

5. A gate driving circuit for a power semiconductor switching device,
wherein the gate driving circuit supplies a drive signal to a gate electrode of the power semiconductor switching device that is a voltage-driven power semiconductor switching device,
wherein an inductor is located between an emitter control terminal or a source control terminal of the switching device and an emitter main terminal or a source main terminal of a semiconductor module, further comprising means for detecting a value of a voltage produced across the inductor during a period when the switching device is being turned ON to make a gate-driving voltage or gate drive resistance variable during said period when the switching device is being turned ON based on the detected value to increase di/dt across said inductor during said period when the switching device is being turned on to shorten the switching time required to turn ON said switching device.

6. A gate driving circuit for a power semiconductor switching device as set forth in claim 5, wherein said means increases the gate-driving voltage during said period.

7. A gate driving circuit for a power semiconductor switching device as set forth in claim 5, wherein said means decreases the gate drive resistance during said period.

8. A gate driving circuit for a power semiconductor switching device as set forth in claim 5, wherein said power semiconductor device is a SiC power device.

* * * * *